US012795819B2

(12) United States Patent
McDaniel et al.

(10) Patent No.: US 12,795,819 B2
(45) Date of Patent: Nov. 10, 2026

(54) BREAKAGE FEATURES PROVIDED FOR CIRCUIT BOARDS

(71) Applicant: Hewlett-Packard Development Company, L.P., Spring, TX (US)

(72) Inventors: Gabriel Scott McDaniel, Boise, ID (US); Jeffrey Harold Luke, Boise, ID (US); John B. Freeney, Boise, ID (US); Kenneth K. Smith, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 238 days.

(21) Appl. No.: 18/716,920

(22) PCT Filed: Dec. 6, 2021

(86) PCT No.: PCT/US2021/072761

§ 371 (c)(1),
(2) Date: Jun. 5, 2024

(87) PCT Pub. No.: WO2023/107130

PCT Pub. Date: Jun. 15, 2023

(65) Prior Publication Data

US 2025/0048543 A1 Feb. 6, 2025

(51) Int. Cl.

| | |
|---|---|
| ***H05K 1/02*** | (2006.01) |
| ***H05K 1/181*** | (2026.01) |
| ***H05K 3/00*** | (2006.01) |
| ***H05K 3/303*** | (2026.01) |

(52) U.S. Cl.

CPC ......... *H05K 1/0275* (2013.01); *H05K 1/0292* (2013.01); *H05K 1/181* (2013.01); *H05K 3/0011* (2013.01); *H05K 3/303* (2013.01)

(58) Field of Classification Search

CPC .... H05K 1/0275; H05K 1/0292; H05K 1/181; H05K 3/0011; H05K 3/303

USPC .......................................................... 361/760

See application file for complete search history.

(56) References Cited

U.S. PATENT DOCUMENTS

| | | | | |
|---|---|---|---|---|
| 5,148,349 | A | 9/1992 | Kogure et al. | |
| 6,050,622 | A * | 4/2000 | Gustafson ........ | G06K 19/07758 70/57.1 |
| 6,693,544 | B1 * | 2/2004 | Hebbecker ........... | G06K 19/077 235/487 |
| 9,934,459 | B2 * | 4/2018 | Tanaka ............. | G06K 19/07749 |
| 10,108,894 | B2 * | 10/2018 | Pic ..................... | G06K 19/0707 |
| 2002/0135481 | A1 | 9/2002 | Conwell et al. | |
| 2004/0066296 | A1 | 4/2004 | Atherton | |
| 2006/0097877 | A1 | 5/2006 | Baba et al. | |
| 2018/0211021 | A1 | 7/2018 | Negi et al. | |

FOREIGN PATENT DOCUMENTS

| | | | |
|---|---|---|---|
| WO | 98/28787 | A1 | 7/1998 |
| WO | 2015/121532 | A1 | 8/2015 |

* cited by examiner

*Primary Examiner* — Binh B Tran

(74) *Attorney, Agent, or Firm* — Foley & Lardner LLP

(57) ABSTRACT

In some examples, an electronic device includes a circuit board, an electronic component mounted to the circuit board, and a breakage feature provided at a target location relative to the circuit board and the electronic component to destroy a functionality of the electronic device when a force is applied to the electronic device for removal of the electronic device from a structure.

13 Claims, 6 Drawing Sheets

BREAKAGE FEATURES PROVIDED FOR CIRCUIT BOARDS

CROSS-REFERENCE TO RELATED APPLICATIONS

This application is a US National Stage Entry under 35 U.S.C. § 371 of International Application No.: PCT/US2021/072761 filed Dec. 6, 2021, which is hereby incorporated by reference in its entirety.

BACKGROUND

A printing device can deliver an agent (also referred to as a printing substance) to a target. With two-dimensional (2D) printing devices, the agent can include a printing liquid or a dry toner to form an image on a print medium. With three-dimensional (3D) printing devices, the agent can include a liquid that is used to process layers of build material to form a 3D object.

BRIEF DESCRIPTION OF THE DRAWINGS

Some implementations of the present disclosure are described with respect to the following figures.

Figure 1A:
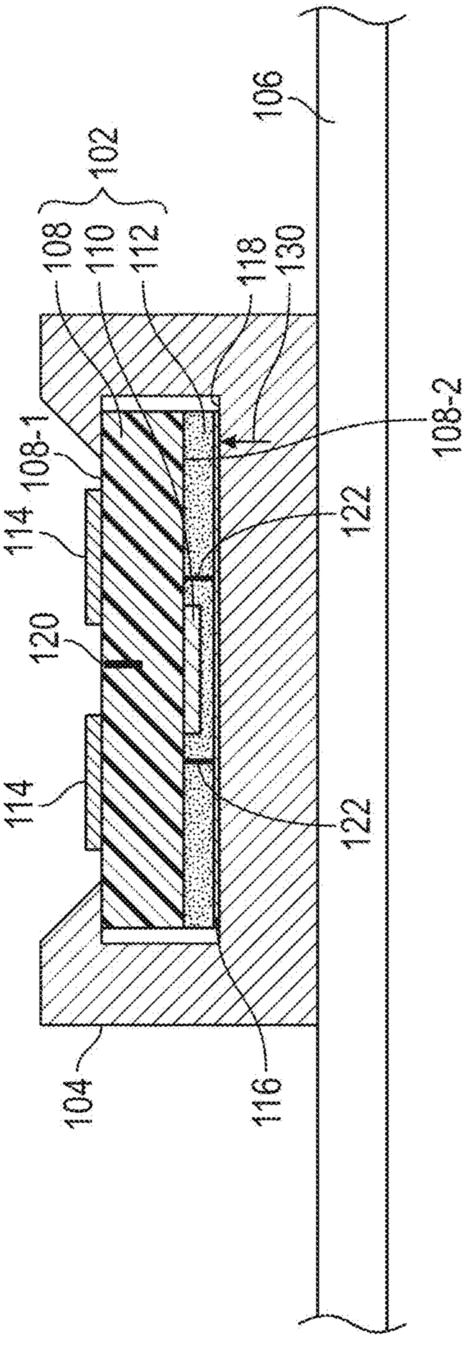
FIGS. 1A-1B, 2A-2B, 3A-3B, 4A-4B, 5A-5B, and 6A-6B show breakage features associated with circuit boards, in accordance with some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an," or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

An agent used in a printing device (a 2D printing device or 3D printing device) can be stored in a removable reservoir, such as a removable cartridge. When the cartridge is depleted of the agent after some amount of use, a user can replace the cartridge with a new cartridge.

The cartridge can include an electronic device. In some examples, the electronic device includes a memory device (e.g., a non-volatile memory device such as a flash memory device) to store information associated with the cartridge. In such examples, the memory device can be referred to as an electronic tag. The electronic tag can store information to allow for identification and authentication of the cartridge when used in a printing device. The authentication can confirm that the cartridge is from an authorized source. In other examples, the electronic device can include a secure processor or microcontroller with an integrated memory to store information associated with the cartridge.

A user may remove an electronic tag from a first cartridge (for example, a genuine cartridge provided by an original manufacturer of a printing device), and place the removed electronic tag on a second cartridge (for example, a non-genuine cartridge from another manufacturer different from the original manufacturer). Once the electronic tag is placed on the second cartridge, a printer device may recognize the second cartridge as the first cartridge, which can result in improper operation or damage to the printer device over time. In other examples, an electronic tag may be moved from an original manufacturer's cartridge to a cartridge from another manufacturer in an attempt to deceive the customer regarding the manufacturer of the cartridge.

In accordance with some implementations of the present disclosure, in an electronic device with a circuit board and an electronic component mounted to the circuit board, a breakage feature is provided at a target location relative to the circuit board and electronic component to destroy the functionality of the electronic device when a force is applied to the electronic device to remove the electronic device from a structure, such as a print cartridge housing.

FIG. 1A is a sectional view of an assembly that includes an electronic device 102 that is affixed to a holder 104 of a print cartridge 106 that contains an agent that can be used in a printing operation. The sectional view of FIG. 1A is taken along section 1A-1A in FIG. 1B, which is a top view of the assembly. Note that the holder 104 is shown in dashed profile in FIG. 1B.

The holder 104 is an example of a structure to which the electronic device 102 can be attached. In some examples, the holder 104 can be formed of a plastic material or a different material. In other examples, the electronic device 102 can be attached to other types of structures, including structures used in non-printing devices. For example, the electronic device 102 can be used in other types of systems, such as computer systems, communications systems, storage systems, places, vehicles, and so forth.

The electronic device 102 includes a circuit board 108 (e.g., formed of a flame retardant 4 (FR4) material or another material), an electronic component 110 (e.g., an integrated circuit chip such as a microcontroller, a memory device, etc.), and a protective layer 112 that encapsulates the electronic component 110 to protect the electronic component 110. For example, the protective layer 112 can be formed of an epoxy potting material or any other type of material that can be used for protecting the electronic component 110, such as a barrier against fluid penetration to the electronic component 110, a shock absorber, and so forth.

The electronic component 110 can include any or some combination of a memory device, a processor, an input/output (I/O) device, and so forth. Although just one electronic component 110 is shown in FIG. 1A, the electronic device 102 can include multiple electronic components mounted to the circuit board 108 in other examples. In some examples, the circuit board 108 is a printed circuit board formed of an FR4 material. More generally, the circuit board 108 is a support substrate in which electrically conductive traces can be formed to electrically connect to electronic component(s) on the support substrate. The electrically conductive traces allow for communication between the electronic component(s) and other component(s). In some examples, electrical contacts 114 can be provided on the circuit board 108 to allow for electrical connection to another component so that the other component can communicate with the electronic component 110.

The electrical contacts 114 are attached to a first external surface 108-1 of the circuit board 108, and the electronic component 110 and protective layer 112 are attached to an opposite second external surface 108-2 of the circuit board 108. In the orientation shown in FIG. 1A, the first external surface 108-1 is an upper surface, while the second external surface 108-2 is a lower surface. If the circuit board 108 is re-oriented such that the circuit board 108 is upside down, then the first external surface 108-1 would be a lower surface and the second external surface 108-2 would be an upper surface. With other orientations of the circuit board 108, the external surfaces 108-1 and 108-2 can have other orientations.

In some examples, an adhesive layer 116 is provided to adhere a lower surface (in the orientation of FIG. 1A) of the protective layer 112 to a support surface 118 of the holder 104. The adhesive layer 116 can include a glue or another type of adhesive.

According to some examples of the present disclosure, deliberately weakened regions can be formed in the circuit board 108 and/or in the protective layer 112. A "deliberately" weakened region can refer to any portion of an electronic device that is formed to be more fragile than a surrounding part of the electronic device, so that the presence of this more fragile portion leads to breakage of a section of the electronic device if a force were to be applied, such as to remove the electronic device from a holder or another structure.

Figure 1B:
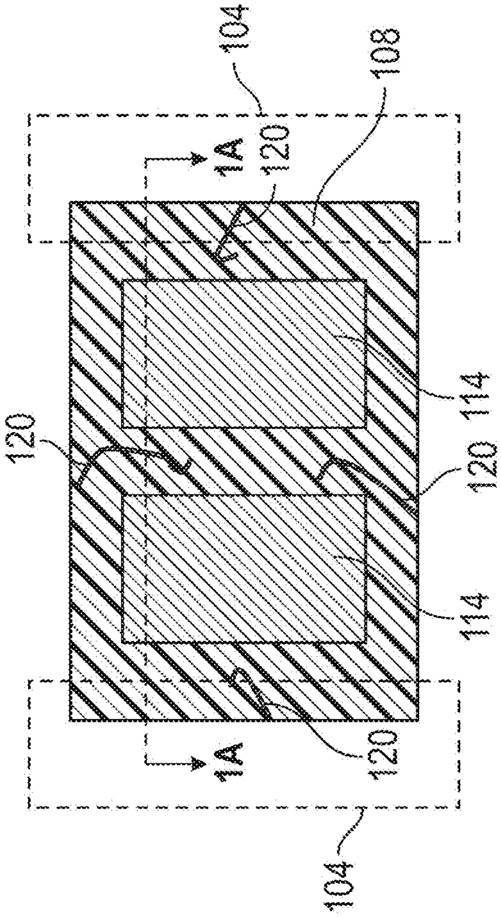

As seen in FIGS. 1A and 1B, weakened regions 120 can be formed in several locations of the circuit board 108. Although FIG. 1B shows four weakened regions 120 formed in the circuit board 108, in other examples, less than four weakened regions 120 or more than four weakened regions 120 can be formed in the circuit board 108.

Also, as further shown in FIG. 1A, weakened regions 122 can be formed in the protective layer 112. Although FIG. 1B shows two weakened regions 122 formed in the protective layer 112, in other examples, less than two weakened regions 122 or more than two weakened regions 122 can be formed in the protective layer 112.

In some examples, the weakened regions 120 or 122 are cuts in the respective circuit board 108 or the protective layer 112. In other examples, the weakened regions 120 in the circuit board 108 can include a portion of the circuit board 108 that is formed of a different material from the rest of the circuit board 108. The different material of the weakened regions 120 may be more brittle than the material of the circuit board 108, for example. Similarly, the weakened regions 122 in the protective layer 112 can include a portion of the protective layer 112 that is formed of a different material from the rest of the protective layer 112. The different material of the weakened regions 122 may be more brittle than the material of the protective layer 112, for example. As a further example, the weakened regions 120 and/or 122 may be formed with more voids than the materials used in the rest of the circuit board 108 and/or the protective layer 112.

The weakened regions 120 in the circuit board 108 can be formed during the manufacture of the circuit board 108, or alternatively, can be formed after manufacture of the circuit board 108, such as by using some type of a cutter to form cuts as the weakened regions 120. Similarly, the weakened regions 122 in the protective layer 112 can be formed during the manufacture of the protective layer 112, or after the manufacture of the protective layer 112.

The weakened regions 120 and/or 122 are examples of breakage features associated with the circuit board 108. The weakened regions 120 and/or 122 are examples of stress concentrators that are formed in the circuit board 108 and/or the protective layer 112. The stress concentrators cause increased stress to be applied in specific region(s) of the circuit board 108 and/or the protective layer 112 in response to an external force, such as the force 130. The increased stress applied at focused region(s) of the circuit board 108 and/or the protective layer 112 can cause breakage of the circuit board 108 and/or the protective layer 112.

FIG. 1A shows an example of where an upward force 130 (in the orientation shown in FIG. 1A) can be applied to the lower surface of the electronic device 102, such as by a user's finger or with a tool, in an attempt to remove the electronic device 102 from the holder 104. Although FIG. 1A shows the force 130 being applied near an edge of the electronic device 102, in other examples, the force 130 can be applied at another point of the electronic device 102.

Due to the presence of breakage features such as the weakened regions 120 and/or 122, the applied force 130 can cause breakage of the circuit board 108 and/or the protective layer 112, which can cause a destruction of the functionality of the electronic device 102. For example, the applied force 130 can break the circuit board 108 at regions corresponding to the weakened regions 120, and/or rip the protective layer 112 that can cause physical damage of the electronic component 110.

As a result of the destruction of the functionality of the electronic device 102, a user that removes the electronic device 102 from the holder 104 would not be able to reuse the electronic device 102 in another cartridge or in another system.

Figure 2A:
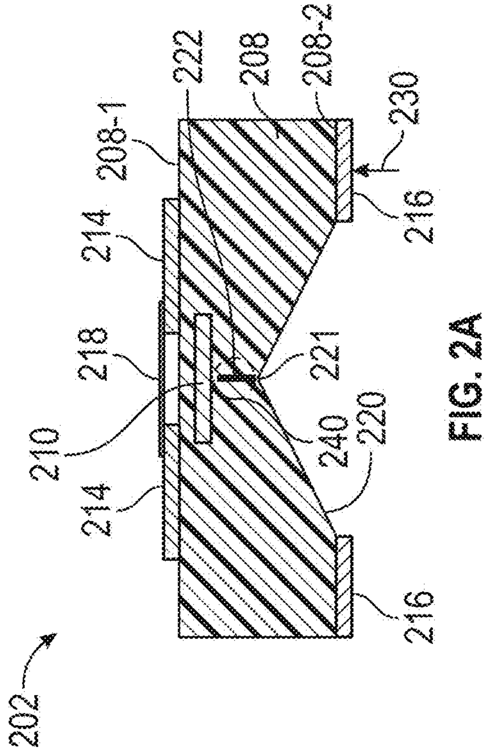
Figure 2B:
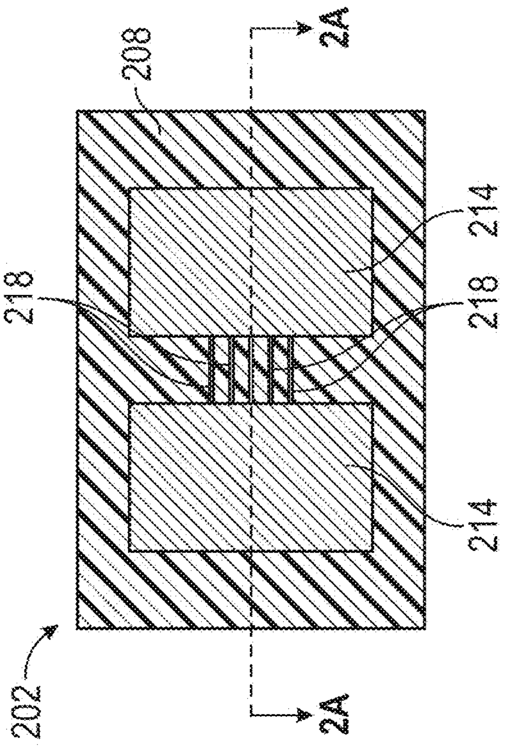

FIGS. 2A and 2B show another example of a breakage feature that can be formed in a circuit board 208 of an electronic device 202. FIG. 2B is a top view of the electronic device 202, and FIG. 2A is a sectional view of the electronic device 202 taken along section 2A-2A in FIG. 2B.

The electronic device 202 includes an electronic component 210 which can be embedded within the circuit board 208 in some examples. Alternatively, the electronic component 210 can be placed on a first external surface 208-1 of the circuit board 208. A second external surface 208-2 of the circuit board 208 is opposite the first external surface 208-1. In the example orientation shown in FIG. 2A, the first external surface 208-1 is an upper surface, while the second external surface 208-2 is a lower surface. In other orientations of the circuit board 208, the external surfaces 208-1 and 208-2 can have other orientations.

Electrical contacts 214 can be attached to the first external surface 208-1 of the circuit board 208. In some examples, electrical conductors 218 can connect the electrical contacts 214 or other components. The electrical conductors 218 can include electrically conductive traces on the first external surface 208-1 or embedded within the circuit board 208. In other examples, the electrical conductors 218 can be omitted.

The breakage feature of the circuit board 208 includes a groove 220 that is formed in the circuit board 208. The groove 220 extends from the second external surface 208-1 into the body of the circuit board 208. In the orientation shown in FIG. 2A, the groove 220 has an apex 221, which corresponds to a focused region where stress is focused to cause breakage of the circuit board at 208 in response to an applied force 230 shown in FIG. 2A. Note that the force 230 can be applied at any point on the second external surface 208-2 to pry the electronic device 202 from a structure (e.g., the holder 104 of FIG. 1A) to which the electronic device 202 is mounted.

In examples according to FIG. 2A, the groove 220 has a generally triangular cross-sectional profile. In other examples, the groove 220 can have a different cross-sectional profile, such as a U-shaped or other curved profile or any other different profile. More generally, the groove 220 extends inwardly into the circuit board 208 from the second external surface 226. The circuit board 208 is to break at a region adjacent a portion of the groove 220 that is most distal from the second external surface 226 (where this region is represented as 240 in FIG. 2A). The electronic component 210 is positioned proximal to the region 240, such that breakage of the circuit board 208 in the region 240 will cause the electronic component 210 to also break.

In further examples, a weakened region 222 (e.g., a cut or other type of weakened region) can be formed in the circuit board in the region 240. For example, the weakened region 222 can extend from the apex 221 of the groove 220 in FIG. 2A. In other examples, the weakened region 222 can be omitted.

As further shown in FIG. 2A, discrete adhesive layers 216 can be attached to the second external surface 208-2 of the circuit board 208. The discrete adhesive layers 216 (which are separate from one another) includes one adhesive layer to the left of the groove 220 and another adhesive layer to the right of the groove 220 (in the orientation of FIG. 2A). The adhesive layers 216 can adhere the circuit board 208 to a holder (e.g., the holder 104 of FIG. 1A) or another structure.

In some examples, the electrical conductors 218 can be located such that they cross the region 240 at which the circuit board 208 is expected to break. By crossing the electrical conductors 218 across the region 240, breakage of the circuit board 208 at the region 240 will cause the electrical conductors 218 to also break, which would render the electronic device 202 non-operational.

In some examples, the circuit board 208 can be formed of a brittle material, such as a paper phenolic material or a brittle plastic material. This would enhance breakage of the circuit board 208 in the region 240 due to the applied force 230. In other examples, the circuit board 208 can be formed of a different material, such as FR4 or another material.

Figure 3A:
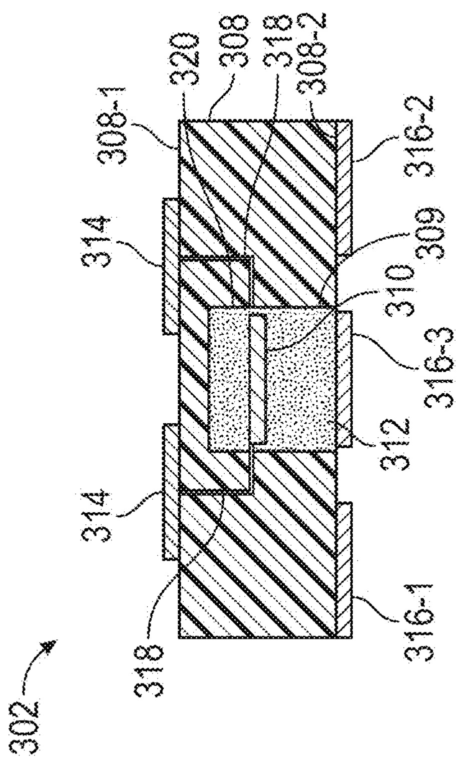
Figure 3B:
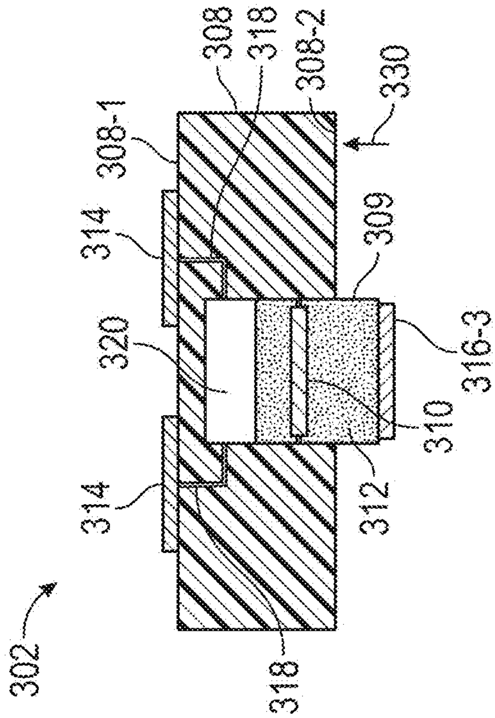

FIGS. 3A and 3B show another example of an electronic device 302 that includes a different type of breakage feature. FIGS. 3A and 3B are sectional views of the electronic device 302 in different states.

In the example of FIGS. 3A and 3B, the breakage feature includes a removable attachment between a subassembly 309 formed in a slot 320 in a circuit board 308. The circuit board 308 includes a first external surface to 308-1 and a second external surface 308-2 that is opposite the first external surface 308-1. The slot 320 extends into the body of the circuit board 308 from the second external surface 308-2. The slot 320 can have a generally rectangular cross-sectional profile to receive the subassembly 309, which also has a generally rectangular cross-sectional profile. In other examples, the slot 320 and the subassembly 309 can have different cross-sectional profiles.

The subassembly 309 includes an electronic component 310 and a protective layer 312 that encapsulates the electronic component 310. FIG. 3A shows the subassembly 309 being held in the slot 320 of the circuit board 308. In some examples, the engagement between the subassembly 309 and inner walls of the slot 320 can be a frictional engagement that prevents the subassembly 309 from falling out during normal operation or handling. In other examples, a weak adhesive or other type of weak fastener (e.g., brittle screws, etc.) can be used to adhere the subassembly 309 to the inner walls of the slot 320.

In the state shown in FIG. 3A, the electronic component 310 is electrically connected by electrically conductive traces 318 to electrical contacts 314 attached to the first external surface 324 of the circuit board 308.

Additionally, discrete adhesive layers 316-1, 316-2, and 316-3 are used to attach the subassembly 309 and the circuit board 308 to a structure, such as the holder 104 shown in FIG. 1A.

The discrete adhesive layer 316-3 adheres the subassembly 309 to the structure. The discrete adhesive layers 316-1 and 316-2 (attached to the second external surface 308-2 on two different sides of the subassembly 309) adhere the circuit board 308 to the structure.

When an upward force 330 is applied on the circuit board 308 (at any point on the second external surface 308-2) to remove the electronic device 302 from the structure, the subassembly 309 can remain adhered to the structure while the circuit board 308 is removed. The subassembly 309 can slide out of the slot 320 when the circuit board 308 is raised in response to the applied force 330. This causes the electrically conductive traces 318 to break, as shown in FIG. 3B, such that the electronic device 302 becomes non-functional.

Figure 4B:
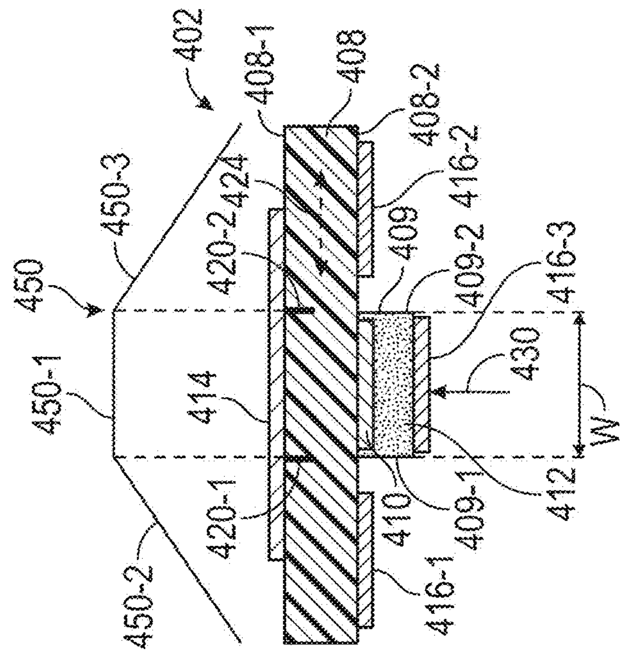
Figure 4A:
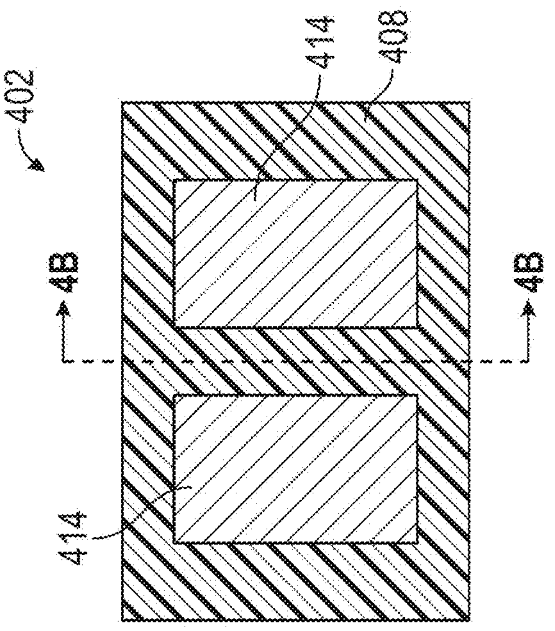

FIGS. 4A and 4B show another example of an electronic device 402 that includes another type of breakage feature. FIG. 4A is a top view of the electronic device 402, and FIG. 4B is a sectional view of the electronic device 402 taken along section 4B-4B in FIG. 4A.

The electronic device 402 includes a circuit board 408 and a subassembly 409 that includes an electronic component 410 and a protective layer 412 that encapsulates the electronic component 410. The subassembly 409 is attached to a second external surface 408-2, which is opposite a first external surface 408-1 to which electrical contacts 414 are mounted.

A discrete adhesive layer 416-3 is used to adhere the subassembly 409 to a structure (e.g., the holder 104 of FIG. 1A), and discrete adhesive layers 416-1 and 416-2 are used to adhere the circuit board 408 to the structure.

Weakened regions 420-1 and 420-2 such as cuts can be formed in the circuit board 408. For example, the weakened regions 420-1 and 420-2 can extend into the body of the circuit board 408 from the first external surface 408-1.

The weakened regions 420-1 and 420-2 are spaced apart from one another along an axis 424 (e.g., width) of the circuit board 408. The distance between the weakened regions 420 can be about the same as a width W of the subassembly 409. Thus, the weakened regions 420-1 and 420-2 are arranged such that the weakened region 420-1 is at a first side 409-1 of the subassembly 409, and the weakened region 420-2 is at an opposite second side 409-2 of the subassembly 409. In other examples, the distance between the weakened regions 420-1 and 420-2 can be less than or greater than the width W of the subassembly 409.

FIG. 4B shows a bending moment represented as a curve 450. In response to an applied upward force 430 (applied at any point on the second external surface 408-2), the bending moment is greatest in a region of the circuit board 408 between the weakened regions 420-1 and 420-2. This greatest bending moment is represented by a curve segment 450-1 in FIG. 4B. The bending moment starts to gradually decrease from respective locations of the weakened regions 420-1 and 420-2, as represented by the curve segments 450-2 and 450-3, respectively.

As a result, in response to the upward force 430, the circuit board 408 can break at the weakened regions 420-1 and 420-2, which can destroy the functionality of the electronic device 402.

Figure 5B:
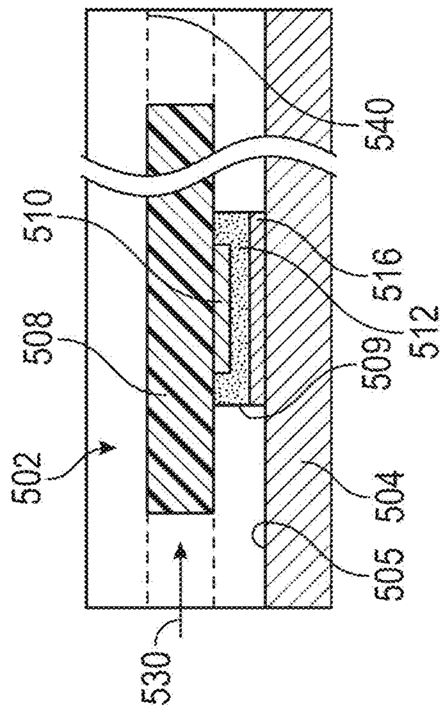
Figure 5A:
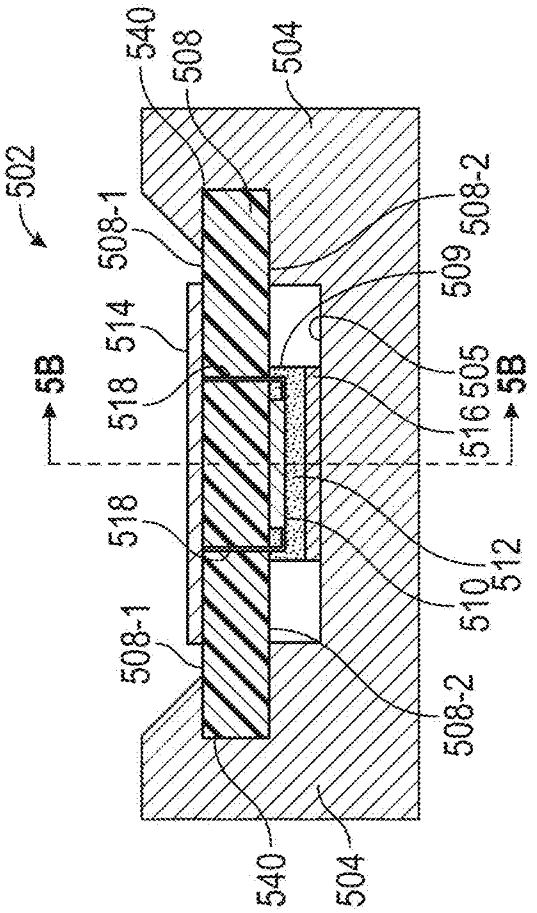

FIGS. 5A and 5B show another example of an electronic device 502 that includes a further type of breakage feature. FIG. 5A is a first sectional view of the electronic device 502 (similar to that of FIG. 4B), and FIG. 5B is a second sectional view of the electronic device 502 taken along section 5B-5B in FIG. 5A.

The electronic device 502 includes a circuit board 508 and a subassembly 509 that includes an electronic component 510 and a material glob 512 that encapsulates the electronic component 510. The material glob 512 can be formed using the same material as the protective layers 112, 212, 312, and 412 discussed above, or could be formed of a different material (e.g., a resin, etc.). The material glob 512 can also be considered to be a protective layer for the electronic component 510.

The subassembly 509 is attached to a second external surface 508-2 of the circuit board 508, which is opposite a first external surface 508-1 of the circuit board 508. Electrical contacts 514 are mounted to the first external surface 508-1. Electrical conductors 518 connect the electronic component 510 to the electrical contacts 514 in the example.

An adhesive layer 516 adheres the subassembly 509 to a support surface 505 of a holder 504 (similar to the holder 104 of FIG. 1A). In some examples, the holder 504 further includes inner slots 540 to receive the circuit board 508. In some examples, the circuit board 508 can slide along the inner slots 540, such as during assembly of the electronic device 502 to the holder 504. Once the electronic device 502 is slid into the holder 504, the adhesive layer 516 can fix the assembly of the circuit board 508 and the subassembly 509 in position inside the holder 504.

If a user or a tool applies a force 530 in a direction shown in FIG. 5B (a lateral force in the orientation of FIG. 5B), the force 530 can urge lateral movement of the circuit board 508 along the inner slots 540. However, because the adhesive layer 516 adheres the subassembly 509 to the support surface 505 of the holder 504, the force 530 can shear the subassembly 509 off the second external surface 508-2 of the circuit board 508, which breaks the electrical conductors 518 and detaches the electronic component 510 from the circuit board 508, thereby rendering the electronic device 502 non-functional.

Figure 6B:
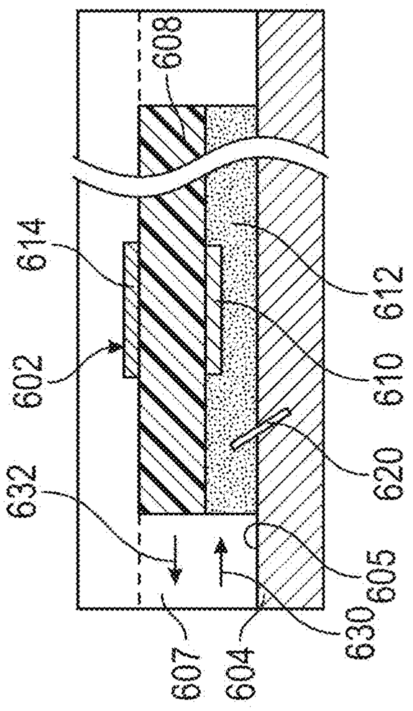
Figure 6A:
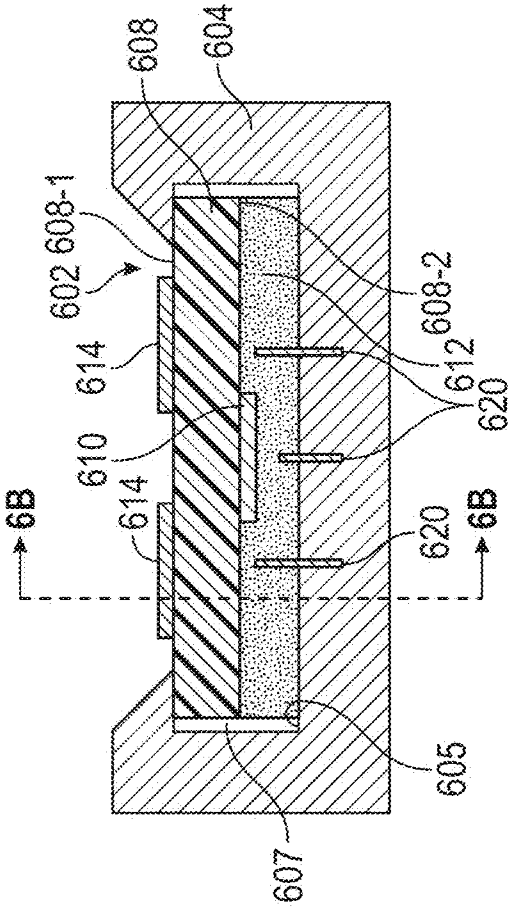

FIGS. 6A and 6B show a further example of an electronic device 602 that includes a different type of breakage feature. FIG. 6A is a first sectional view of the electronic device 602 (similar to that of FIG. 1A), and FIG. 6B is a second sectional view of the electronic device 602 taken along section 6B-6B in FIG. 6A.

The electronic device 602 includes a circuit board 608, an electronic component 610 mounted to a second external surface 608-2 of the circuit board 608 that is opposite a first external surface 608-1 of the circuit board 608. A protective layer 612 encapsulates the electronic component 610. Electrical contacts 614 are mounted to the first external surface 608-1 of the circuit board 608.

The electronic device 602 is mounted in a holder 604. The lower surface of the protective layer 612 is mounted on a support surface 605 of the holder 604.

In some examples, spikes 620 are used to hold the protective layer 612 to the holder 604. The spikes 620 are planted into the support surface 605 and extend into the body of the holder 604 below the support surface 605. The spikes 620 have sharp tips that penetrate into the protective layer 612 when the electronic device 602 is installed in a receiving chamber 607 of the holder 604.

The spikes 620 can be in the form of blades, needles, and so forth. The spikes 620 are examples of cutting elements that can be used to penetrate into the protective layer 612 to hold the electronic device 602 in place. Removal of the electronic device 602 along a direction that is angled with respect to the cutting elements causes destruction of the protective layer 612 and detachment of the electronic component 610 from the circuit board 608.

In the second sectional view of FIG. 6B, a spike 620 is shown as slanted with respect to the support surface 605 of the holder 604. The spike 620 is slanted toward a direction 632, which is the direction of insertion of the electronic device 602 into the holder's receiving chamber 607. Since the spike 620 is slanted towards the insertion direction 632, the spike 620 does not cut into the protective layer 612 as the electronic device 602 is inserted into the holder 604. Each spike 620 has a spring-type behavior in that moving the electronic device 602 over the spike 620 can press the spike 620 downwardly.

After insertion, if the electronic device 602 is moved in the opposite direction 630 (which is opposite the direction 632), the slanted spike 620 will pop back up (due to the spring loading) and penetrate into the protective layer 612. Thus, during mounting of the electronic device 602 into the holder 604, the electronic device 602 is pushed into the holder 604 in the direction 632, followed by pulling of the electronic device 602 in the opposite direction 630 by a small amount to allow the spikes 620 to penetrate into and engage the protective layer 612. In this way, the spikes 620 can hold the electronic device 602 in place.

If an unauthorized user were to later attempt to remove the electronic device 602 from the holder 604, such as by applying a force in the direction 630, the spikes 620 will break apart the protective layer 612, which can damage the electronic component 610 (and/or electrical conductors) that would render the electronic device 602 non-operational.

More generally, each spike 620 can have different unidirectional behaviors when the electronic device 602 is moved in respective different directions (630 and 632), such that when the electronic device 602 is moved in the direction 630 the electronic device 602 is destroyed, and when the electronic device 602 is moved in the direction 632 the electronic device 602 is not destroyed. The different unidirectional behaviors can be contributed by any or some combination of various factors, such as the shape/geometry of the components and the presence of spring-loaded elements.

Figure 7:
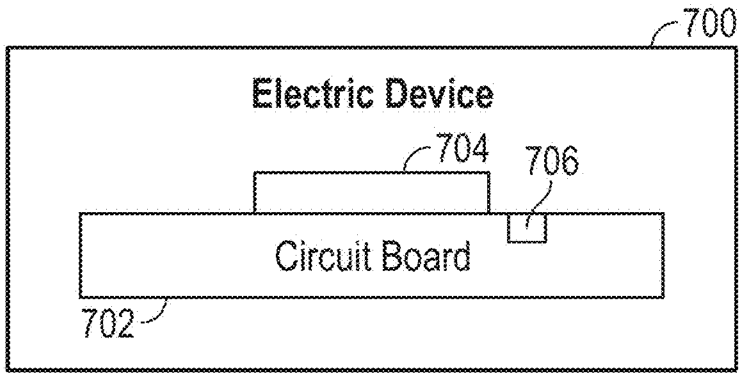
FIG. 7 is a block diagram of an electronic device according to some examples.

FIG. 7 is a block diagram of an electronic device 700 that includes a circuit board 702 and an electronic component 704 mounted to the circuit board 702.

The electronic device 700 further includes a breakage feature 706 provided at a target location relative to the circuit board 702 and the electronic component 704 to destroy a functionality of the electronic device 700 when a force is applied to the electronic device 700 for removal of the electronic device 700 from a structure, such as a holder or another structure.

In some examples, the breakage feature includes a deliberately weakened region provided in the circuit board 702.

In some examples, the breakage features further includes a deliberately weakened region provided in a protective layer that encapsulates the electronic component 704.

Figure 8:
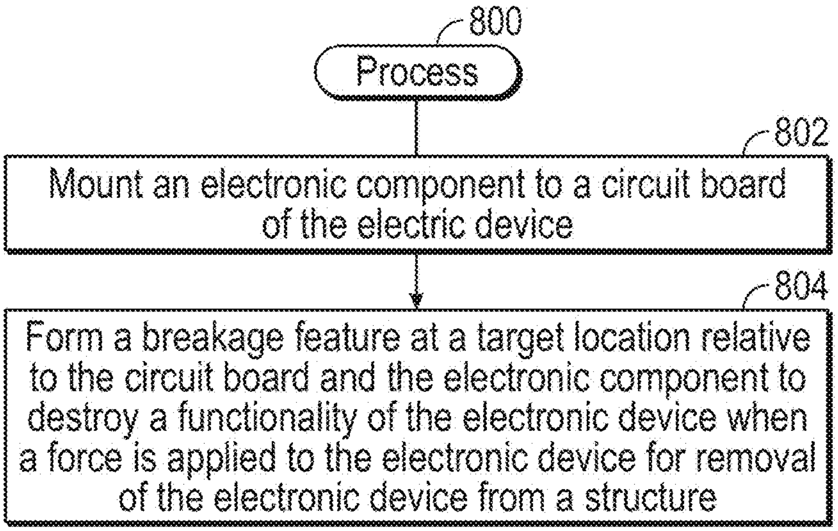
FIG. 8 is a flow diagram of a process according to some examples.

FIG. 8 is a flow diagram of a process 800 of forming an electronic device, according to some examples.

The process 800 includes mounting (at 802) an electronic component to a circuit board of the electronic device.

The process 800 includes forming (at 804) a breakage feature at a target location relative to the circuit board and the electronic component to destroy a functionality of the electronic device when a force is applied to the electronic device for removal of the electronic device from a structure.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. An electronic device comprising:

a circuit board;

an electronic component mounted to the circuit board;

a protective layer that encapsulates the electronic component; and a breakage feature provided at a target location relative to the circuit board and the electronic component to destroy a functionality of the electronic device when a force is applied to the electronic device for removal of the electronic device from a structure, wherein the breakage feature comprises a deliberately weakened region provided in the circuit board and a deliberately weakened region provided in the protective layer.

2. The electronic device of claim 1, wherein the protective layer is to adhere to the structure.

3. The electronic device of claim 1, wherein the breakage feature comprises a groove formed in the circuit board to provide a stress concentrator to break the circuit board.

4. The electronic device of claim 3, wherein the circuit board has an external surface, and the groove extends inwardly into the circuit board from the external surface, wherein the circuit board is to break at a region adjacent a portion of the groove that is most distal from the external surface, and wherein the electronic component is positioned proximal to the region.

5. The electronic device of claim 4, wherein the circuit board comprises electrically conductive traces that pass through the region and that are to break when the circuit board breaks.

6. An electronic device comprising:

a circuit board;

an electronic component mounted to the circuit board;

a protective layer that encapsulates the electronic component, wherein the electronic component and the protective layer form a subassembly; and a breakage feature provided at a target location relative to the circuit board and the electronic component to destroy a functionality of the electronic device when a force is applied to the electronic device for removal of the electronic device from a structure, wherein the subassembly is detachable from the circuit board in response to the force.

7. The electronic device of claim 6, wherein the subassembly is positioned in a slot formed in the circuit board, and wherein a detachment of the subassembly from the circuit board comprises a removal of the subassembly from the slot.

8. The electronic device of claim 7, comprising:

a first discrete adhesive to adhere the subassembly to the structure; and a second discrete adhesive separate from the first discrete adhesive to adhere the circuit board to the structure.

9. The electronic device of claim 6, wherein the subassembly is placed on an external surface of the circuit board, and wherein a detachment of the subassembly from the circuit board comprises shearing off the subassembly from the external surface of the circuit board.

10. An electronic device comprising:

a circuit board;

an electronic component mounted to the circuit board;

a protective layer that encapsulates the electronic component, wherein the electronic component and the protective layer form a subassembly placed on an external surface of the circuit board;

a breakage feature provided at a target location relative to the circuit board and the electronic component to destroy a functionality of the electronic device when a force is applied to the electronic device for removal of the electronic device from a structure;

a first discrete adhesive to adhere the subassembly to the structure; and a second discrete adhesive separate from the first discrete adhesive to adhere the circuit board to the structure, wherein the breakage feature comprises deliberately weakened regions formed in the circuit board.

11. An electronic device comprising:

a circuit board;

an electronic component mounted to the circuit board;

a protective layer that encapsulates the electronic component; and a breakage feature provided at a target location relative to the circuit board and the electronic component to destroy a functionality of the electronic device when a force is applied to the electronic device for removal of the electronic device from a structure, wherein the breakage feature comprises a cutting element that penetrates into the protective layer, where removal of the electronic device along a direction that is angled with respect to the cutting element causes destruction of the protective layer and detachment of the electronic component.

12. A method comprising:

mounting an electronic component to a circuit board of an electronic device;

encapsulating the electronic component with a protective layer; and forming a breakage feature at a target location relative to the circuit board and the electronic component to destroy a functionality of the electronic device when a force is applied to the electronic device for removal of the electronic device from a structure, wherein forming the breakage feature comprises forming a deliberately weakened region in the circuit board and forming a deliberately weakened region in the protective layer.

13. The method of claim 12, wherein the breakage feature is to cause breaking of the circuit board in response to the force or removal of the electronic component from the circuit board in response to the force.

* * * * *